United States Patent
Bansal et al.

(10) Patent No.: US 6,821,908 B1
(45) Date of Patent: Nov. 23, 2004

(54) IN-SITU METHOD FOR PRODUCING A HYDROGEN TERMINATED HYDROPHOBIC SURFACE ON A SILICON WAFER

(75) Inventors: Iqbal K. Bansal, Sandy Hook, CT (US); Joel L. Goodrich, Westford, MA (US)

(73) Assignee: Mia-Com Inc.,, Lowell, MA (US)

( * ) Notice: Subject to any disclaimer, the term of this patent is extended or adjusted under 35 U.S.C. 154(b) by 131 days.

(21) Appl. No.: 09/952,050

(22) Filed: Sep. 10, 2001

(51) Int. Cl.$^7$ ................................ H01L 21/302
(52) U.S. Cl. ............... 438/745; 433/750; 433/751; 134/1.1; 134/1.2
(58) Field of Search ................... 438/745, 750, 438/751; 134/1.1, 1.2, 1.3, 2, 36; 216/106, 108

(56) References Cited

U.S. PATENT DOCUMENTS

| | | | |
|---|---|---|---|
| 5,656,097 A | * | 8/1997 | Olesen et al. ............... 134/1 |
| 5,932,022 A | * | 8/1999 | Linn et al. .................. 134/2 |
| 6,048,405 A | * | 4/2000 | Skrovan et al. ............. 134/1 |
| 6,219,936 B1 | * | 4/2001 | Kedo et al. ................ 34/381 |

* cited by examiner

Primary Examiner—Lan Vinh

(57) ABSTRACT

At least one silicon wafer is loaded into a closed vessel that contains a first solution that includes ammonium hydroxide, hydrogen peroxide and DI water. This acidic solution is removed from the vessel and DI water is introduced into the vessel until wafers are completely immersed. The DI water is then removed from the vessel and a second solution that includes hydrofluoric acid, hydrochloric acid solution and DI water is added to the vessel to fully immerse the wafer. The second solution is then removed from the vessel, and as the second solution is being drained from the vessel, an alcohol solution in a hot and low-pressure nitrogen carrier gas is introduced to the vessel, such that as the level of the liquid within the vessel falls below the height of the wafer within the vessel, the surface of the wafer is dried due to surface tension. The thin coating of alcohol solvent on the wafer ensures that the surface of the wafer is hydrogen terminated, thus hydrophobic. The technique of the present invention occurs in a single vessel.

6 Claims, 2 Drawing Sheets

IN-SITU METHOD FOR PRODUCING A HYDROGEN TERMINATED HYDROPHOBIC SURFACE ON A SILICON WAFER

BACKGROUND OF THE INVENTION

The invention relates to the field of integrated circuit manufacturing, and in particular to a technique for processing a silicon wafer to provide a hydrophobic surface.

During the manufacturing of integrated circuits, silicon wafers are prepared for thermal diffusion and oxidation operations. The preparation includes cleaning the wafer to remove sub-micron surface contamination. This often includes first immersing the wafer in an alkaline mixture of deionized (DI) water, hydrogen peroxide and ammonium hydroxide to remove light organic residues. In this step, the solution may generally be in the range of 5:1:1 to 7:2:1, and be heated to 75–85° C. The wafer is then immersed in DI water to rinse out the chemicals as well as particulate contaminants from its surface. Following the DI water rinse, the wafer is processed in an acidic mixture (e.g., 5:1:1 to 7:2:1 DI water, hydrogen chloride, and hydrogen peroxide solution) to remove trace metallic impurities. The wafers are then rinsed again in DI water. As known, this process is often referred to as a RCA clean chemistry.

A limitation of this technique is that a silicon wafer, when immersed in the hydrogen peroxide solution, produces an oxide film on its surface. To remove this oxide film from the wafer surface, the silicon wafer is typically processed in a hydrofluoric acid solution that has been diluted with DI water. At this stage of processing, the wafer has a relatively good hydrophobic surface, but if one were to simply remove the wafer following the immersion in the hydrofluoric acid solution, there is a significant safety issue since hydrofluoric acid is extremely aggressive on bone, and thus dangerous to humans. Therefore, the wafer needs to be rinsed again in DI water prior to handling. However, DI water is essentially an oxidizing medium that undesirably creates oxides on the surface of the wafer. Therefore, in order to obtain a relatively good hydrophobic surface, handling of the wafer immediately following immersion in the hydrofluoric acid solution is required, regardless of its safety and handling issues.

Therefore, there is a need for developing a new cleaning technique that provides a silicon wafer with a hydrogen-terminated hydrophobic surface. Further, this new technique needs to be capable of producing a hydrophobic silicon wafer with no hydrofluoric acid solution on its surface so the wafer can be safely handled.

SUMMARY OF THE INVENTION

Briefly, according to an aspect the present invention, at least one silicon wafer is loaded into a single closed vessel that contains a first solution of ammonium hydroxide, hydrogen peroxide solution and DI water. This first solution is removed from the vessel and DI water is then introduced into the vessel until the wafer is completely immersed. The DI water is removed from the vessel. Then, a second solution of hydrofluoric acid, hydrochloric acid solution and DI water is added to the vessel to fully immerse the wafer. The second solution is then removed from the vessel, and as the second solution is slowly being drained from the vessel, an alcohol solution in a hot and low-pressure nitrogen carrier gas is introduced to the vessel. As the level of the liquid within the vessel is falling below the height of the wafer within the vessel, the wafer is dried.

Advantageously, the technique of the present invention occurs in a single and closed vessel. The cleaning process is in-situ. In addition, the thin coating of alcohol solvent on the wafer results in a lower surface tension which facilitates ensuring that the surface of the wafer is hydrogen terminated, thus hydrophobic.

These and other objects, features and advantages of the present invention will become apparent in light of the following detailed description of preferred embodiments thereof, as illustrated in the accompanying drawings.

DETAILED DESCRIPTION OF THE INVENTION

Figure 1:
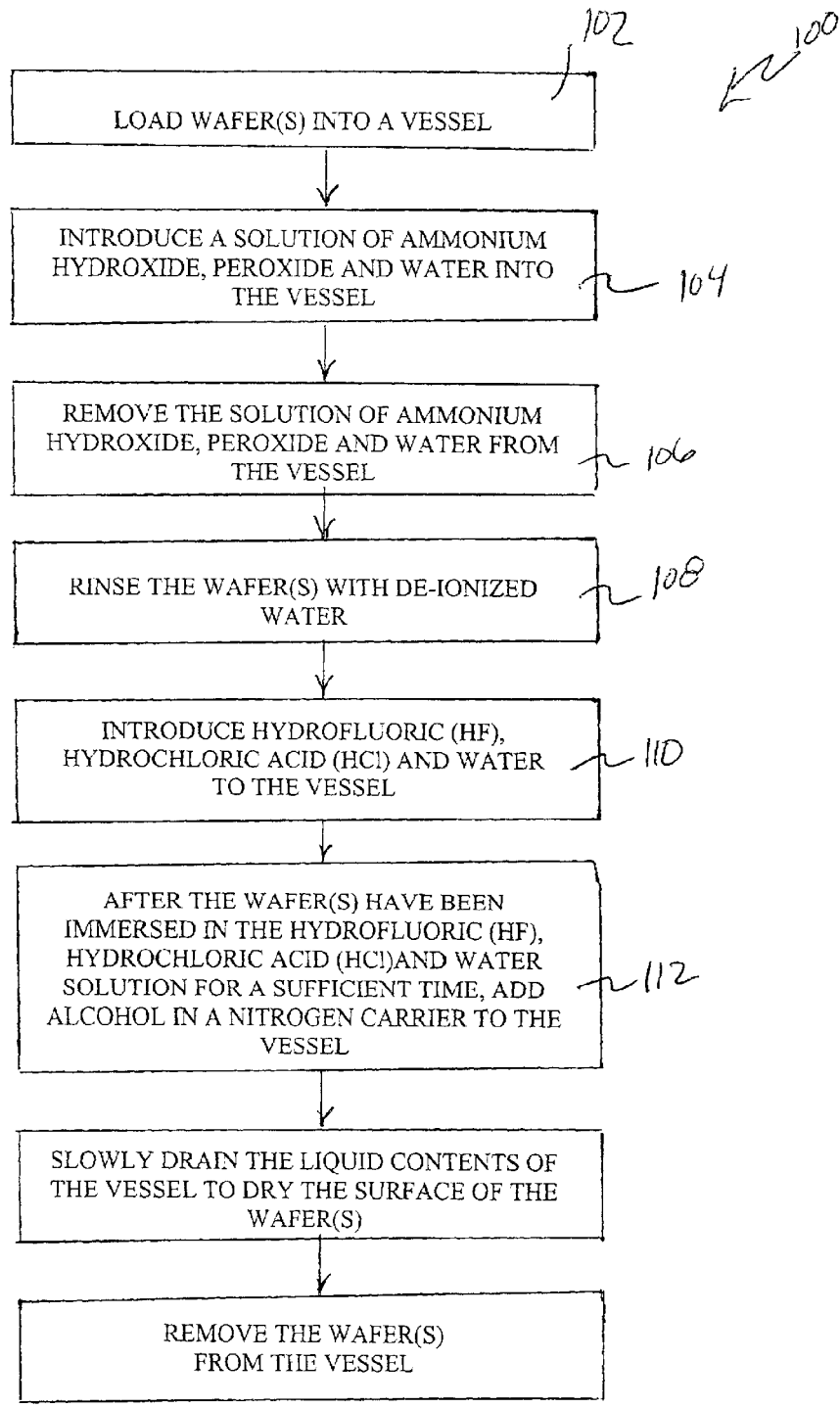
FIGS. 1 is flow chart illustration of process steps according to an aspect of the present invention.

FIG. 1 is a flow chart illustration of process steps 100 according to an aspect of the present invention. In step 102 silicon wafers (e.g., two 25-wafer product lots) are placed into a single fluid-containing closed vessel. In one embodiment the vessel may be an Olympian Model 100X processing chamber available from SCD Mount View Inc. of Mountain View, Calif., a subsidiary of FSI International. In step 104 a first solution of ammonium hydroxide, hydrogen peroxide solution and DI water is introduced into the vessel. The amount of solution in step 104 is sufficient to ensure that the wafers are completely immersed into this solution. After a sufficient amount of time has elapsed, in step 106 the first solution is then removed from the vessel. In one embodiment, this solution is drained from the bottom of the vessel.

The wafers are then rinsed with DI water in step 108. This step is preferably performed while the wafers remain stationary in the vessel. The DI water is then removed from the processing chamber, preferably by draining from the bottom of this vessel. In step 110 a second solution of hydrofluoric acid, hydrochloric acid solution and DI water is added to the vessel to fully immerse the wafers in the solution. In a preferred embodiment the ratio of the second solution is 1:2:200 by volume, respectively. However, the range may be from about 1:2:50 to about 1:2:500 by volume, respectively. The second solution is drained from the vessel in step 112. The drainage rate is slow and controlled. Significantly, as this second solution is being drained from the vessel, an alcohol solution in a hot and low-pressure nitrogen carrier gas is added into the vessel. For example, the pressure may be about 25–75 psig, preferably 50 psig±10 psig, and the temperature may be about 150–300° F., preferably 235° F.±5° F. The alcohol solvent and the second solution are immiscible (i.e., alcohol does not mix with the second solution). As the vessel is slowly drained, a thin coating of alcohol solvent remains on the surface of the wafer since the alcohol is the last liquid to contact the wafer. Significantly, this alcohol coating inhibits the formation of oxides on the surface of the wafer. The lower surface tension is created when wafers are pulled slowly through a liquid level surface interface. The difference in surface tension produces a flow, which literally strips water from the surface of the wafer, leaving it dry. This motionless drying technique is often referred to as surface tension drying or Marangoni drying.

FIGS. 2A–2D pictorially illustrate the process of draining the second solution from the vessel in step 112 (FIG. 1), while adding the alcohol in a nitrogen carrier gas.

Figure 2A:
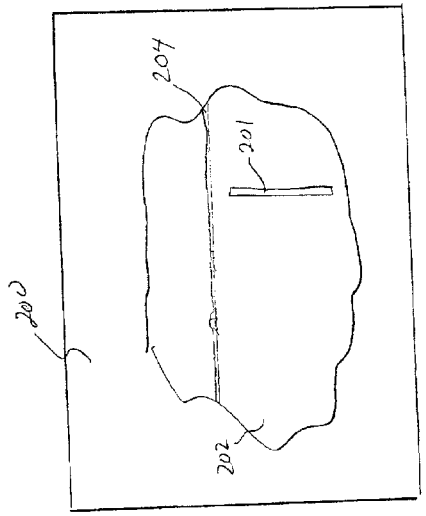
FIGS. 2A–2D pictorially illustrate the process of removing the second solution of hydrofluoric acid, hydrochloric acid solution and DI water from the vessel, while carrying alcohol solution in a hot and low-pressure nitrogen gas.
Figure 2B:
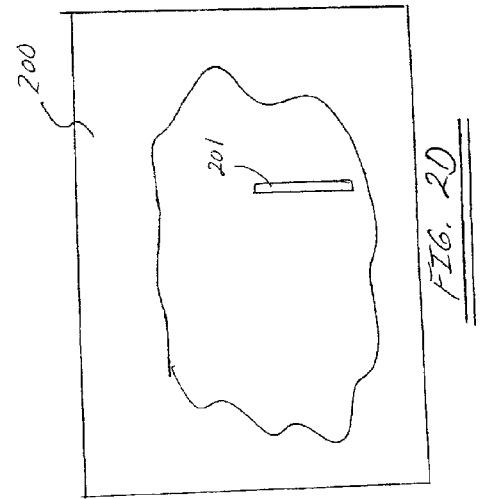
Figure 2C:
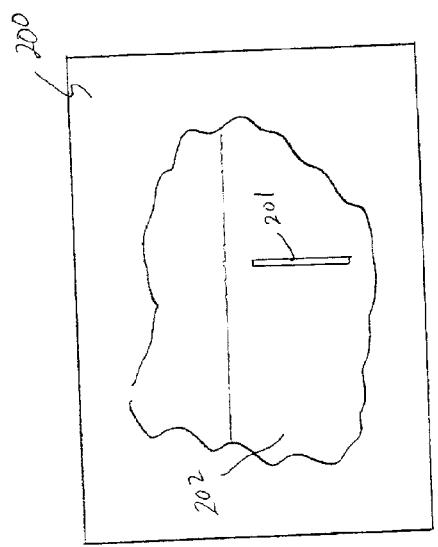
Figure 2D:
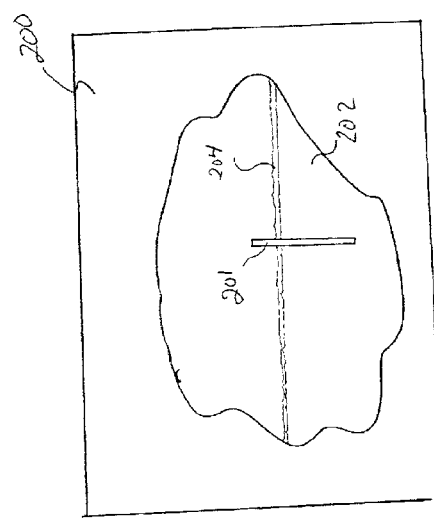

Specifically, FIG. 2A illustrates a side view of a vessel 200 partially broken away, with wafer 201 immersed in the second solution of hydrofluoric acid, hydrochloric acid and DI water 202. FIG. 2B illustrates alcohol 204 in the hot low-pressure nitrogen carrier gas added to the vessel, and the immiscible nature of the alcohol 204 and the second solution 202. FIG. 2C illustrates a side view of the vessel 200 partially broken away as contents of the vessel are being drained in step 112. FIG. 2D illustrates the vessel with the contents drained following step 112 (FIG. 1). Of course it is contemplated that the wafer may be slowly removed from the vessel, rather than slowly drawing the liquid from the vessel in step 112 (FIG. 1).

Significantly, silicon wafers processed according to the present invention are characterized by an improved hydrophobic surface in contrast to the surfaces provided by the prior art. In addition, the cleaning process is performed substantially in-situ in a "closed" vessel, and as a result less handling of the wafers occurs since multiple vessels are not required for this cleaning process. Furthermore, the cleaning process of the present invention is characterized by considerably less consumption of DI water and is environmentally friendly.

Silicon wafers processed according to the present invention may of course include silicon-on-insulator (SOI) wafers. The cleaning process of the present invention may be used for direct-silicon hydrophobic bonding operations, ultra-high vacuum chemical vapor deposition (UHVCVD), pre-metal deposition cleaning, post chemi-mechanical polish (CMP) cleaning, and pre-diffusion/oxidation chemical cleaning.

Although the present invention has been shown and described with respect to several preferred embodiments thereof, various changes, omissions and additions to the form and detail thereof, may be made therein, without departing from the spirit and scope of the invention.

What is claimed is:

1. A method of treating a silicon wafer in a single vessel having an up and down orientation, said method comprising:

treating at least one silicon wafer in said vessel with an acidic solution under conditions to remove oxide from a surface of said silicon wafer, said acidic solution defining a level in said chamber;

introducing an alcohol solution into said vessel, said alcohol solution forming a layer on said level of said acidic solution; and effecting the relative downward movement of said level of said acidic solution across said silicon wafer thereby coating the surface of said silicon wafer with said alcohol solution.

2. The method of claim 1, wherein said alcohol solution is introduced into said vessel while effecting the relative downward movement of said level across said silicone wafer.

3. The method of claim 1, wherein effecting the relative downward movement of said level across said silicon wafer is performed by draining said vessel of said acidic solution.

4. The method of claim 1, wherein said acidic solution comprises hydrofluoric acid, hydrochloric acid and deionized water.

5. The method of claim 1, further comprising, prior to treating said wafer with said acidic solution:

treating said silicon wafer with an alkaline solution in said vessel; and rinsing said silicon wafer of said alkaline solution in said vessel.

6. The method of claim 1, wherein introducing said alcohol solution to said vessel comprises adding isopropyl alcohol (IPA) solvent in a nitrogen carrier gas.

\* \* \* \* \*